US012482629B2

(12) United States Patent
Sasaki et al.

(10) Patent No.: US 12,482,629 B2
(45) Date of Patent: Nov. 25, 2025

(54) SPECIMEN PROCESSING HOLDER AND SPECIMEN PROCESSING METHOD

(71) Applicant: JEOL Ltd., Tokyo (JP)

(72) Inventors: Yoshikazu Sasaki, Tokyo (JP); Tomohisa Fukuda, Tokyo (JP); Tomohiro Mihira, Tokyo (JP); Norimasa Sakuta, Tokyo (JP); Misumi Kadoi, Tokyo (JP); Tatsuhito Kimura, Tokyo (JP)

(73) Assignee: JEOL Ltd., Tokyo (JP)

( * ) Notice: Subject to any disclaimer, the term of this patent is extended or adjusted under 35 U.S.C. 154(b) by 389 days.

(21) Appl. No.: 18/222,068

(22) Filed: Jul. 14, 2023

(65) Prior Publication Data

US 2024/0021405 A1 Jan. 18, 2024

(30) Foreign Application Priority Data

Jul. 15, 2022 (JP) ................................ 2022-113678

(51) Int. Cl.
*H01J 37/20* (2006.01)

(52) U.S. Cl.
CPC .................................... *H01J 37/20* (2013.01)

(58) Field of Classification Search
CPC ................. H01J 37/20; H01J 2237/022; H01J 2237/204; H01J 37/185; H01J 2237/201; H01J 2237/31749; H01J 2237/31745; H01J 37/3056; G01Q 30/20; G01N 1/28
USPC ............................... 250/453.11, 492.1–492.3
See application file for complete search history.

(56) References Cited

U.S. PATENT DOCUMENTS

| | | | |
|---|---|---|---|
| 6,538,254 B1 | 3/2003 | Tomimatsu et al. | |
| 2002/0050565 A1 | 5/2002 | Tokuda et al. | |
| 2003/0183776 A1 | 10/2003 | Tomimatsu et al. | |
| 2008/0067374 A1 | 3/2008 | Ono et al. | |
| 2008/0073582 A1 | 3/2008 | Shichi et al. | |
| 2010/0213386 A1 | 8/2010 | Man et al. | |
| 2015/0206706 A1 | 7/2015 | Man | |
| 2018/0342369 A1* | 11/2018 | Kataoka .............. | C23C 14/5833 |
| 2020/0035444 A1 | 1/2020 | Nicoletti et al. | |

FOREIGN PATENT DOCUMENTS

| | | | |
|---|---|---|---|
| EP | 1443541 A2 | 8/2004 | |
| JP | WO9905506 A1 | 2/1999 | |
| JP | 2002150990 A | 5/2002 | |

(Continued)

OTHER PUBLICATIONS

Office Action issued in JP2022113678 on Apr. 16, 2024.

(Continued)

*Primary Examiner* — Michael Maskell
(74) *Attorney, Agent, or Firm* — The Webb Law Firm

(57) ABSTRACT

A holder includes a first sub holder configured to hold a primary specimen, and a second sub holder configured to hold a support member. The primary specimen is processed in a first state where the holder is disposed within a first specimen processing apparatus. Subsequently, in a second state where the holder is disposed within a second specimen processing apparatus, a secondary specimen is prepared from the primary specimen, the secondary specimen is moved onto the support member, and a thin film specimen is prepared from the secondary specimen.

12 Claims, 24 Drawing Sheets

(56) References Cited

FOREIGN PATENT DOCUMENTS

| | | | |
|---|---|---|---|
| JP | 2006139917 | A | 6/2006 |
| JP | 201543343 | A | 3/2015 |
| JP | 2015185457 | A | 10/2015 |
| JP | 2018200815 | A | 12/2018 |
| JP | 201983179 | A | 5/2019 |
| WO | 2012046775 | A1 | 4/2012 |

OTHER PUBLICATIONS

Partial European Search Report issued in EP23182024.2 on Dec. 18, 2023.

Extended European Search Report issued in EP23182024.2 on Feb. 16, 2024.

* cited by examiner

SPECIMEN PROCESSING HOLDER AND SPECIMEN PROCESSING METHOD

CROSS REFERENCE TO RELATED APPLICATION

This application claims priority to Japanese Patent Application No. 2022-113678 filed Jul. 15, 2022, the disclosure of which is hereby incorporated by reference in its entirety.

BACKGROUND OF THE DISCLOSURE

Field of the Disclosure

The present disclosure relates to a specimen holder for processing (hereinafter referred to as a "specimen processing holder") and a specimen processing method, and more particularly to a technique for preparing a specimen to be observed with an electron microscope.

Description of Related Art

Prior to specimen observation with a transmission electron microscope, it is necessary to prepare a thin film specimen from an original specimen. To prepare a thin film specimen from an original specimen, various specimen preparation methods have been proposed, including a thin film specimen preparation method in which a cross section processing apparatus or a first specimen processing apparatus, and a precision processing apparatus or a second specimen processing apparatus are used sequentially.

A cross section processing apparatus is configured to expose a desired cross section of a primary specimen (original specimen) by processing the primary specimen. The cross section processing apparatus typically includes a shield plate that is configured to partially block an ion beam to thereby shape the ion beam. The shaped ion beam is then emitted to the primary specimen for processing. The cross section processing apparatus is also referred to as a Cross section Polishing apparatus (CP apparatus).

A precision processing apparatus is configured to prepare, from the processed primary specimen, a thin film specimen to be observed with a transmission electron microscope. Typically, a block-shape secondary specimen is prepared from the processed primary specimen, and a thin film specimen is prepared from the block-shape secondary specimen. The thin film specimen may be prepared directly from the original specimen. The precision processing apparatus typically irradiates a specimen with a focused ion beam (FIB), and therefore the precision processing apparatus is also referred to as an FIB apparatus. An FIB apparatus including a scanning electron microscope is referred to as a composite beam processing observation apparatus or an FIB/SEM apparatus.

Typically, a first specimen processing holder is disposed for the cross section processing apparatus, and a second specimen processing holder that is different from the first specimen processing holder is disposed for the precision processing apparatus. Therefore, holder change is performed at the time of delivery of a specimen from the cross section processing apparatus to the precision processing apparatus. While WO 99/005506 and JP 2002-150990 A disclose specimen processing apparatuses, neither WO 99/005506 nor JP 2002-150990 A discloses a holder including a plurality of sub holders.

SUMMARY OF THE DISCLOSURE

Holder change during a series of processes for processing a specimen involves various problems, including contamination of a specimen, falling of a specimen, an increase in the specimen preparation time, and an increase in operator's burden, for example. To change holders while processing a specimen without exposing the specimen to the air, it is necessary to handle the specimen in a special manner.

An embodiment of the disclosure is therefore aimed toward eliminating the need for holder change during specimen processing. Another embodiment of the disclosure is aimed toward shortening the specimen processing time or mitigating operator's burden during the specimen processing.

In accordance with an aspect of the disclosure, a specimen processing holder includes a holder body, a first sub holder, and a second sub holder. The first sub holder is disposed on the holder body and includes a shield member configured to partially block a first ion beam to generate a shaped first ion beam. The first sub holder is configured to hold a primary specimen to be processed with the shaped first ion beam. The second sub holder is disposed on the holder body and is configured to hold a secondary specimen prepared by processing the primary specimen with a second ion beam.

In accordance with another aspect of the disclosure, a specimen processing method includes providing a specimen processing holder including a first sub holder configured to hold a primary specimen and a second sub holder configured to hold a support member; processing the primary specimen in a first state where the specimen processing holder is disposed within a first specimen chamber of a first specimen processing apparatus; after the processing of the primary specimen, transferring the specimen processing holder from the first specimen chamber into a second specimen chamber of a second specimen processing apparatus; preparing a secondary specimen from the processed primary specimen in a second state where the specimen processing holder is disposed within the second specimen chamber; moving the secondary specimen onto the support member in the second state; and preparing an observation specimen from the secondary specimen disposed on the support member.

BRIEF DESCRIPTION OF THE DRAWINGS

Embodiments of the present disclosure will be described based on the following figures, wherein.

DESCRIPTION OF NON-LIMITING EMBODIMENTS

Figure 1:
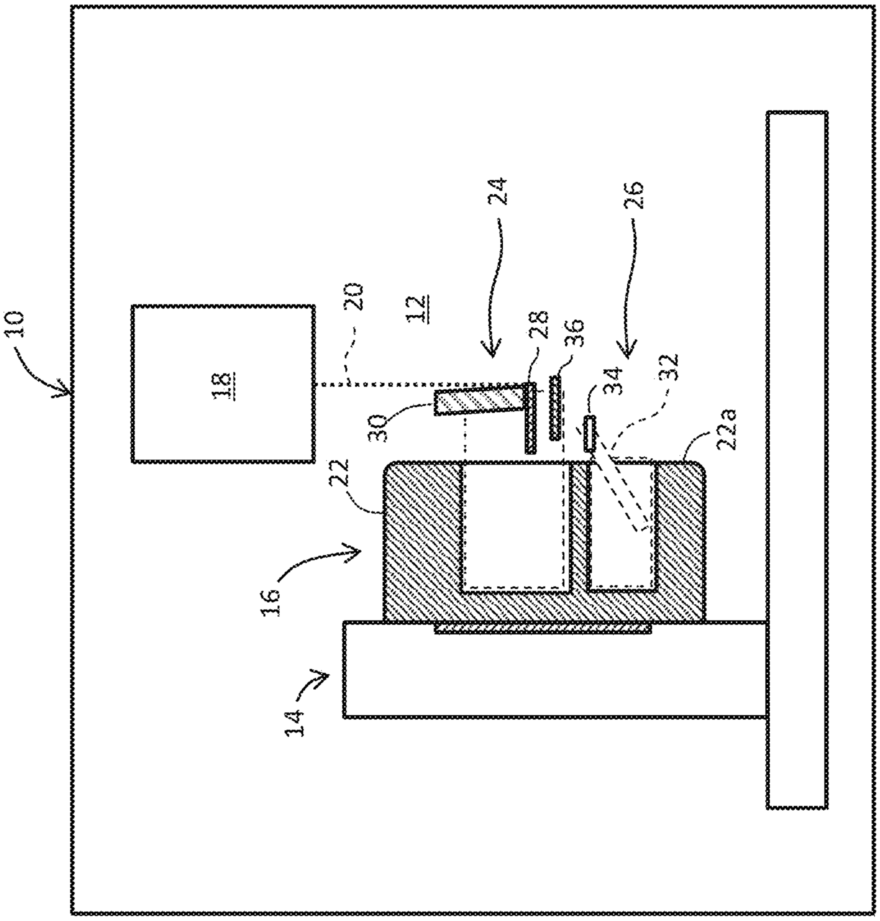
FIG. 1 schematically illustrates a first specimen processing apparatus.

Embodiments of the disclosure will be described below by reference to the drawings.

(1) Summary of Embodiments

A specimen processing holder according to an embodiment includes a holder body, a first sub holder, and a second sub holder. The first sub holder is disposed in the holder body and includes a shield member configured to partially block a first ion beam to thereby generate a shaped first ion beam. The first sub holder holds a primary specimen to be processed by the shaped first ion beam. The second sub holder is disposed in the holder body and holds a secondary specimen prepared by processing the primary specimen with a second ion beam.

The specimen processing holder includes the first sub holder and the second sub holder. This configuration eliminates the need for a change of the specimen processing holder during a series of processes for processing a specimen step by step with a plurality of processing apparatuses. This therefore reduces a possibility of occurrence of specimen contamination and specimen falling, for example, and also achieves a reduction in the specimen preparation time and in the operator's burden.

The shield member is a shield plate, for example. The first ion beam is a first processing beam, and the second ion beam is a second processing beam that is different from the first ion beam. The secondary specimen is a block-shape (small block shape) specimen or a thin film specimen. A thin film specimen may be prepared by processing the block shape specimen held by the second sub holder with the second ion beam.

In an embodiment, the specimen processing holder has an x direction, a y direction, and a z direction that are orthogonal to one another. The z direction is parallel to a center axis of the first ion beam. The shield member includes a shield face extending in the y direction and the z direction. The first sub holder and the second sub holder are arranged along the z direction. The shield member applies an x-direction shaping effect to the first ion beam.

The above configuration allows the first sub holder and the second sub holder to be disposed adjacent to each other, thereby downsizing the specimen processing holder. Typically, the first sub holder has a shape extending in the x direction and the y direction, and the second holder similarly has a shape extending in the x direction and the y direction. The two sub holders having such a shape are disposed in parallel to each other.

In an embodiment, assuming that upstream and downstream in the z direction are defined in accordance with a traveling direction of the first ion beam, the second sub holder is disposed downstream of the first sub holder along the z direction. This configuration prevents the second sub holder from obstructing the processing of the primary specimen with the first ion beam.

In an embodiment, the first sub holder is configured to hold the primary specimen with a process end of the primary specimen protruding from the shield face. The second sub holder is configured to directly or indirectly hold a support member having a support end that is configured to support the secondary specimen. An anti-contamination plate is disposed between the process end and the support end. The anti-contamination plate extends in the x direction and the y direction.

During processing of the primary specimen, contaminants fly off rearward (downstream) of the primary specimen. The above configuration enables the anti-contamination plate to catch the flying contaminants or enables the anti-contamination plate to prevent further flying of the contaminants. This enables prevention of contamination of the second sub holder, and particularly contamination of the support member.

In an embodiment, the holder body includes a top face facing in the x direction, a first well having a first opening connected to the top face, and a second well having a second opening connected to the top face. The first well houses the first sub holder and the second well houses the second sub holder. The first well and the second well are arranged along the z direction. This configuration facilitates mounting of the first sub holder and the second sub holder to the holder body, and further facilitates removal of the first sub holder and the second sub holder from the holder body.

The primary specimen and the secondary specimen are positioned within a space (processing space) adjacent to the top face of the holder body. The height of the process end in the primary specimen in the x direction and the height of the support end of the support member in the x direction may be equal. In other words, the process end of the primary specimen and the support end of the support member may be located along the center axis of the first ion beam. This configuration facilitates control of the operation of the movable stage (specimen stage).

The specimen processing holder according to an embodiment includes a cartridge configured to hold a support member configured to support the secondary specimen. The second sub holder holds the cartridge. As the support member is typically a very small member, handling the support member directly is likely to cause a drop of the support member and other problems. Meanwhile, handing the cartridge or handing the support member indirectly may prevent these problems, including a drop of the support member. Various types of cartridges may be used as the above cartridge. The cartridge may also be referred to as a retainer.

In an embodiment, the cartridge includes a movable mount holding the support member, and an inclination mechanism configured to incline the movable mount. The second sub holder includes a container portion configured to receive the cartridge that is inserted therein; and a portion configured to come into contact with the inclination mechanism during insertion of the cartridge into the container portion to cause the inclination mechanism to operate.

This configuration enables automatic optimization of the position and orientation of the support member during setting of the cartridge to the second sub holder. More specifically, this configuration enables positioning of the support member at a location suitable for processing of the secondary specimen with the second ion beam and also enables the support member to assume an orientation suitable for processing of the secondary specimen with the second ion beam.

A specimen processing method according to an embodiment includes a providing step, a primary specimen processing step, a transfer step, a secondary specimen preparing step, a moving step, and a thin film specimen preparing step. The providing step provides a specimen processing holder including a first sub holder configured to hold a primary specimen and a second sub holder configured to hold a support member. The primary specimen processing step processes the primary specimen in a first state where the specimen processing holder is disposed within a first specimen chamber of a first specimen processing apparatus. The transfer step transfers the specimen processing holder from the first specimen chamber into a second specimen chamber of a second specimen processing apparatus after the processing of the primary specimen. The secondary specimen preparing step prepares a secondary specimen from the processed primary specimen in a second state where the specimen processing holder is disposed within the second specimen chamber. The moving step moves the secondary specimen onto the support member in the second state. The thin film specimen preparing step prepares an observation specimen from the secondary specimen disposed on the support member.

According to the above method, the common specimen processing holder is sequentially disposed in the first specimen processing apparatus and the second specimen processing apparatus. This eliminates the need for change of the holder and transfer of the specimen after processing of the primary specimen. The secondary specimen has a block shape, for example, and, in this configuration, a thin film specimen or an observation specimen is prepared from the block shape specimen.

In an embodiment, the second sub holder is configured to hold a cartridge including the support member. After the preparing of the observation specimen or the thin film specimen, the cartridge is removed from the second sub holder and is mounted on an observation holder.

In an embodiment, a cap is attached to the specimen processing holder before transferring the specimen processing holder. Thereafter, in the second state, the cap is removed from the specimen processing holder before preparing the secondary specimen from the processed primary specimen. This configuration enables transfer and processing of the primary specimen and the secondary specimen without exposing the primary specimen and the secondary specimen to the air. This configuration further facilitates temperature control of the primary specimen and the secondary specimen. In an embodiment, after preparing the secondary specimen, the cap is attached to the specimen processing holder once again. Thereafter, the specimen processing holder with the cap attached thereon is transferred.

In an embodiment, contaminants generated by processing of the primary specimen are caught by an anti-contamination plate disposed between the primary specimen and the support member. This configuration enables prevention or reduction of contamination of the support member and other components, caused by disposing the two sub holders adjacent to each other.

(2) Details of Embodiments

FIG. 1 schematically illustrates a first specimen processing apparatus 10. The first specimen processing apparatus 10 is a cross section processing apparatus or a primary processing apparatus. The first specimen processing apparatus 10 includes a first specimen chamber 12 serving as a vacuum chamber. A movable stage (specimen stage) 14 is disposed in the first specimen chamber 12. A specimen processing holder (hereinafter referred to simply as a "holder") 16 according to a first embodiment is mounted on the movable stage 14. The movable stage 14 has a horizontally moving mechanism and a vertically moving mechanism, for example.

The holder 16 is a holder to be shared. Specifically, the holder 16 is to be sequentially mounted on the first specimen processing apparatus 10 and a second specimen processing apparatus, which will be described below. The first specimen processing apparatus 10 includes a beam source 18 that generates a first ion beam 20 that is, in the illustrated example, an argon ion beam. The beam source 18 generates the first ion beam 20 in a conical shape.

The holder 16 includes a holder body 22, a first sub holder 24, and a second sub holder 26. The first sub holder 24 includes a shield plate 30 and holds a primary specimen 28. The shield plate 30 partially blocks the first ion beam to generate a shaped first ion beam, which is then emitted to the primary specimen 28. More specifically, a process end of the primary specimen 28 is irradiated with the shaped first ion beam. Cutting processing of the primary specimen 28 with the first ion beam 20 continues until a desired cross section of the primary specimen 28 is exposed.

The second sub holder 26 holds a cartridge 32 including a movable mount 34 that is inclinable and an inclination mechanism that determines the inclination angle of the movable mount 34. The movable mount 34 holds a support member. In the second specimen processing apparatus, a secondary specimen generated by processing the primary specimen is attached to a support end of the support member, as will be described below.

The holder 16 includes an anti-contamination plate 36 between the process end of the primary specimen 28 and the support end of the support member held by the cartridge 32. During processing of the primary specimen 28, contaminants including shavings fly off rearward of the primary specimen 28. The anti-contamination plate 36 catches the flying contaminants, thereby preventing contamination of the support member and other components.

The holder body 22 has a top face 22*a* or a face facing rightward in FIG. 1. The process end of the primary specimen 28 is located within a processing space adjacent to the top face 22*a* and the support end of the support member is also located within the processing space. The first specimen processing apparatus 10 has a mechanism that removes a cap attached to the holder 16 or attaches the cap onto the holder 16, which is not illustrated in FIG. 1.

Figure 2:
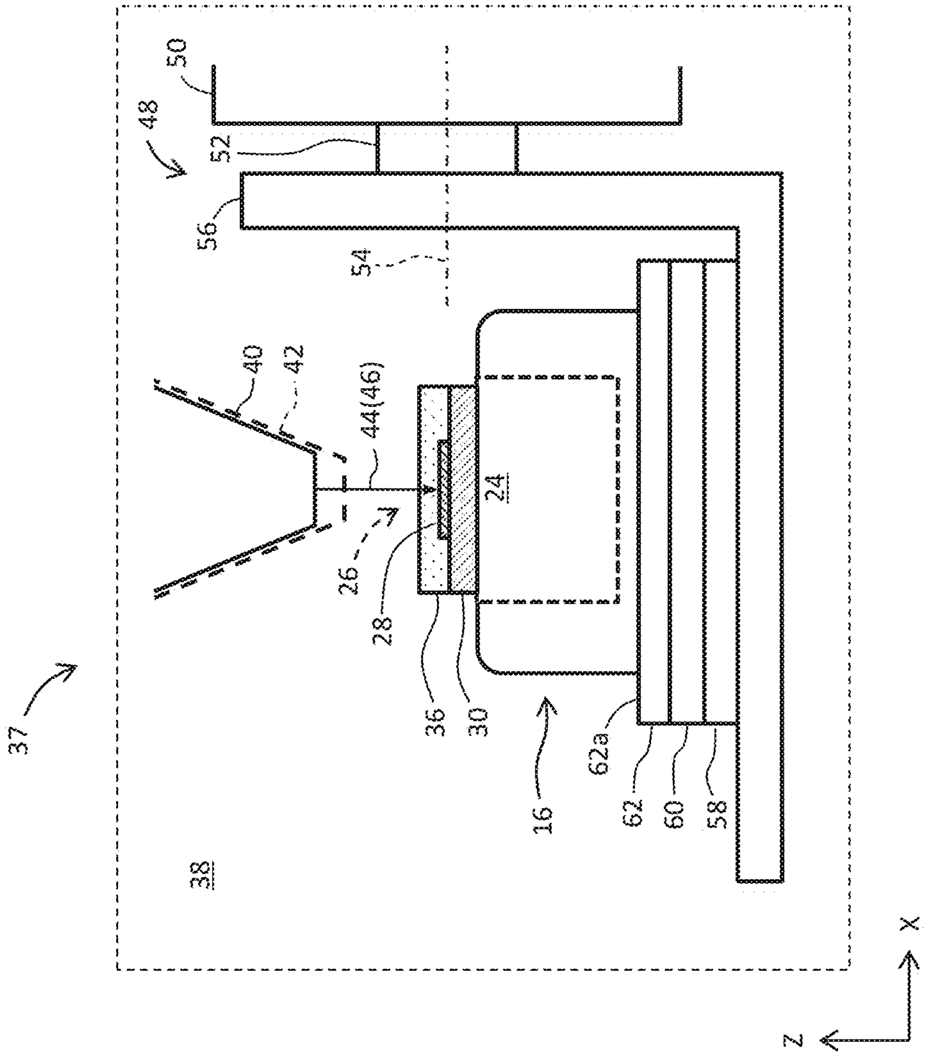
FIG. 2 schematically illustrates a second specimen processing apparatus
Figure 3:
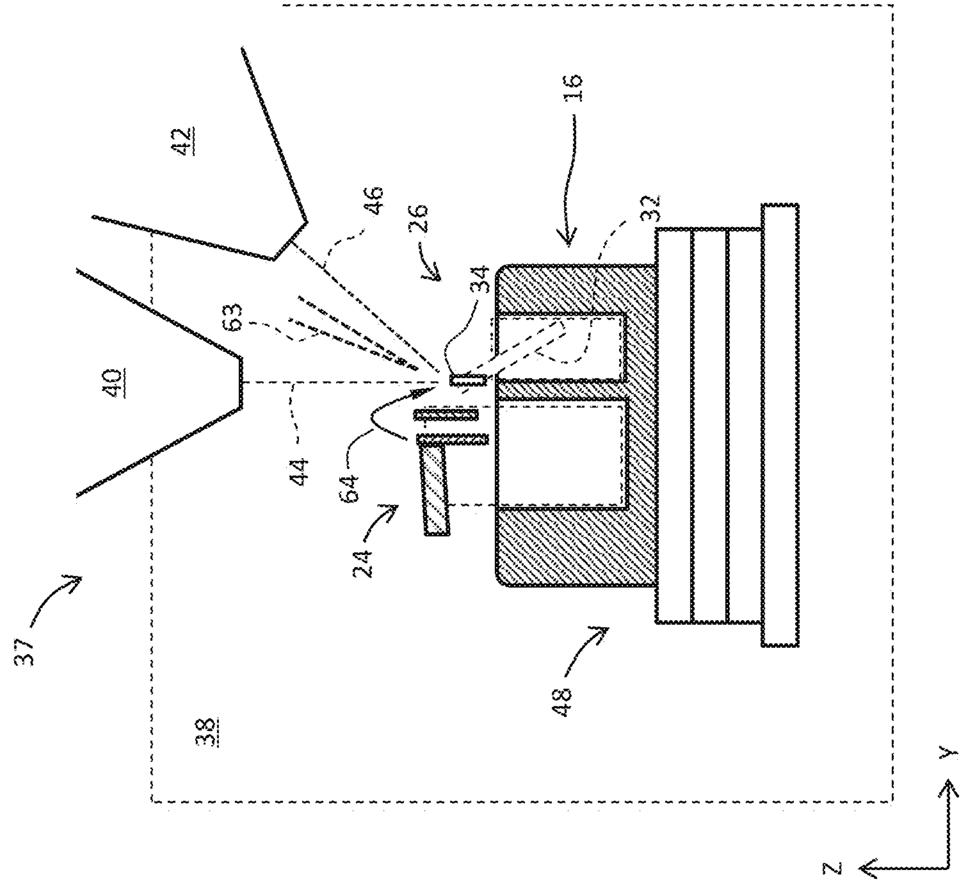
FIG. 3 schematically illustrates another example second specimen processing apparatus.

FIG. 2 illustrates a second specimen processing apparatus 37. More specifically, FIG. 2 illustrates processing of the primary specimen in the second specimen processing apparatus 37. The holder 16 is removed from the first specimen processing apparatus illustrated in FIG. 1 and is then placed within a second specimen chamber 38 of the second specimen processing apparatus 37 illustrated in FIG. 2. The second specimen chamber 38 is a vacuum chamber. In FIG. 2 and FIG. 3 which will be described below, an X direction corresponds to a first horizontal direction, a Y direction corresponds to a second horizontal direction, and a Z direction corresponds to a vertical direction. FIG. 2 corresponds to a front view including the X direction and the Z direction.

The second specimen processing apparatus 37 is a precision processing apparatus or the secondary processing apparatus. In an embodiment, the second specimen processing apparatus 37 processes a specimen with a second ion beam 46 that is specifically a gallium ion beam that is a focused ion beam. The second specimen processing apparatus 37 includes a scanning electron microscope. Specifically, the second specimen processing apparatus 37 includes an SEM lens-barrel 40 that generates an electron beam 44, and an FIB lens-barrel 42 that generates the second ion beam 46. In FIG. 2, the SEM lens-barrel 40 and the FIB lens-barrel 42 are arranged in a direction through the sheet or in the Y direction. A center axis of the electron beam 44 and a center axis of the second ion beam 46 intersect at a coincidence point at a predetermined intersecting angle.

A movable stage (specimen stage) 48 is disposed within the second specimen chamber 38. The holder 16 is attached to the movable stage 48. The movable stage 48 includes an elevation mechanism 50, a tilt mechanism 52, a first slide mechanism 58, a second slide mechanism 60, and a rotation mechanism 62. The first slide mechanism 58 yields a sliding movement in the Y direction in an original state illustrated in FIG. 2, and the second slide mechanism 60 yields a sliding movement in the X direction in the original state illustrated in FIG. 2. The holder 16 is fixed to a top face 62*a* of the rotation mechanism 62. Reference numeral 54 indicates a tilt axis. A further mechanism that performs fine adjustment in the Z direction may also be disposed along with the tilt mechanism 52. The movable stage 48 adjusts the position and orientation of the holder 16. The illustrated movable stage 48 shows an example configuration and may have another configuration.

As described above, the holder 16 includes the first sub holder 24 and the second sub holder 26. The second holder 26, which is located behind the first holder 24 in FIG. 2, is not shown in FIG. 2. The first sub holder 24 holds the primary specimen, and the second sub holder 26 holds the support member to which the secondary specimen generated by processing the primary specimen is to be attached. The second specimen processing apparatus 37 includes a mechanism that removes a cap attached to the holder 16 or attaches the cap to the holder 16. Such a mechanism is not shown in FIG. 2.

FIG. 3 illustrates transfer and processing of the secondary specimen in the second specimen processing apparatus 37. FIG. 3 corresponds to a side view including the Y direction and the Z direction. In FIG. 3, the same elements as those illustrated in FIG. 2 are denoted with the same reference numerals. The second sub holder 26 holds the cartridge 32 including the movable mount 34 to receive the support member having a support end composed of a plurality of protrusions.

The secondary specimen is prepared by processing the primary specimen. The secondary specimen has a block shape, for example. The secondary specimen is picked up by a pickup mechanism (transfer mechanism) 63 and is then attached to the support end of the support member (see reference numeral 64) using an adhesion gas. Subsequently, the secondary specimen attached to the support end is processed with the second ion beam to prepare a thin film specimen as a processed secondary specimen. The thin film specimen is a specimen to be observed with the transmission electron microscope. The thin film specimen may be prepared from the primary specimen, in which case the thin film specimen is transferred.

After the thin film specimen is prepared, the holder 16 is removed from the second specimen processing apparatus 37, then the second sub holder 26 is removed from the holder 16, and the cartridge 32 is further removed from the second sub holder 26. The cartridge 32 that is removed is then attached to an observation holder (TEM holder) that is not shown. The second specimen processing apparatus 37 includes a mechanism that removes a cap from the holder 16 and attaches the cap to the holder 16.

Referring now to FIG. 4 to FIG. 12, the holder according to the first embodiment will be described in detail.

Figure 4:
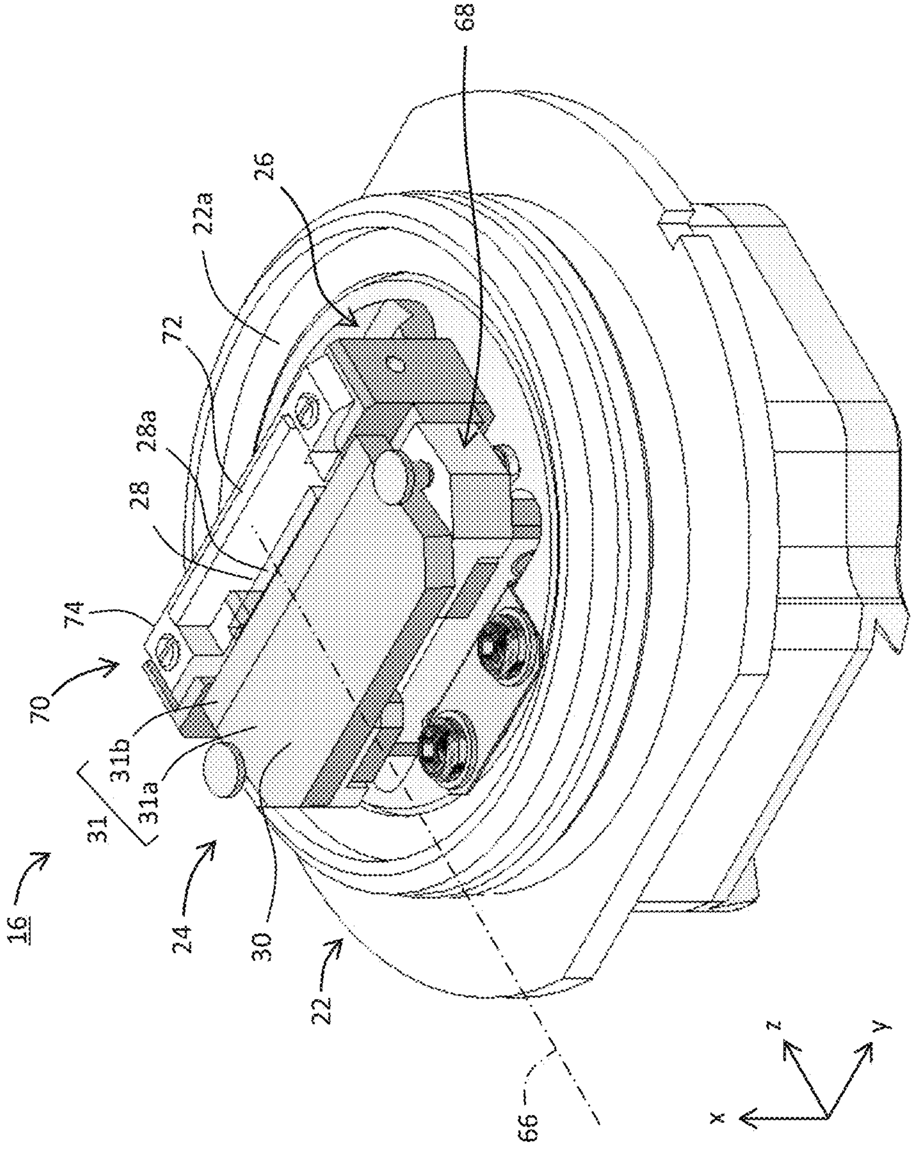
FIG. 4 is a perspective view of a specimen processing holder according to a first embodiment.

FIG. 4 illustrates the holder 16 according to the first embodiment. As described above, the holder 16 includes the holder body 22, the first sub holder 24, and the second sub holder 26. The holder 16 has the x direction, the y direction, and the z direction orthogonal to one another. The z direction is parallel to the center axis 66 of the first ion beam. The top face 22*a* of the holder body 22 faces in the x-direction; therefore, the top face 22*a* extends in the y direction and the z direction.

The first sub holder 24 and the second sub holder 26 are arranged along the z direction. Assuming that upstream and downstream in the z direction are defined according to the traveling direction of the first ion beam, the second sub holder 26 is disposed downstream of the first sub holder 24 in the z direction.

Both the first sub holder 24 and the second sub holder 26 have a shape extending in the x direction and the y direction. The first sub holder 24 and the second sub holder 26 are disposed in parallel and adjacent to each other. This configuration avoids an increase in the size of the holder 16. The diameter of the holder body 22 is within a range of 40 mm to 60 mm, for example. The height, or the width in the x direction, of the holder body 22 is within a range of 25 mm to 35 mm, for example.

The first sub holder 24 includes a first sub holder body 68. The first sub holder body 68 holds the shield plate 30 and the primary specimen 28. The primary specimen 28 has a plate shape, and the first ion beam has a conical shape. The shield plate 30 partially blocks the first ion beam to thereby generate a shaped first ion beam. The shield plate 30 has a shield face 31 extending in the y direction and the z direction. As described above, the z direction is parallel to the center axis of the first ion beam. More specifically, in the illustrated example configuration, the shield face 31 includes a slope face 31*a* and a planar face 31*b*. The slope face 31*a* is slightly inclined relative to the z axis or the center axis 66, and the planar face 31*b* is parallel to the z axis. The slope face 31*a* applies a shaping effect to the first ion beam.

A portion of the primary specimen 28 protrudes from the shield face 31. This portion corresponds to a process end 28*a*. The thickness of the process end 28*a* in the x-direction or the protrusion amount of the primary specimen 28 is 100 μm, for example. The process end 28*a* is irradiated with the shaped first ion beam. Cross section processing is thus performed to expose a desired cross section. The primary specimen 28 is a semiconductor device, for example.

An anti-contamination unit 70 is disposed between the first sub holder 24 and the second sub holder 26. In practice, in the configuration example illustrated in FIG. 4, the anti-contamination unit 70 is assembled to the first sub holder 24. The anti-contamination unit 70 includes an anti-contamination plate 72, and a frame 74 that holds the anti-contamination plate 72. The anti-contamination plate 72 has a shape extending in the x-direction and the y-direction, and is made of a nonmagnetic light element that includes carbon, for example. The size and position of the anti-contamination plate 72 are determined such that the anti-contamination plate 72 shields the entire second sub holder 26 when viewed from the process end 28*a*.

Irradiation of the primary specimen 28 with the first ion beam causes contaminants (shavings) to fly off from the primary specimen 28 to rearward. The flying contaminants are caught by the anti-contamination plate 72. The anti-contamination plate 72 shields the support member, when viewed from the process end 28*a*, to thereby prevent contamination of the support end that supports the secondary specimen.

Figure 5:
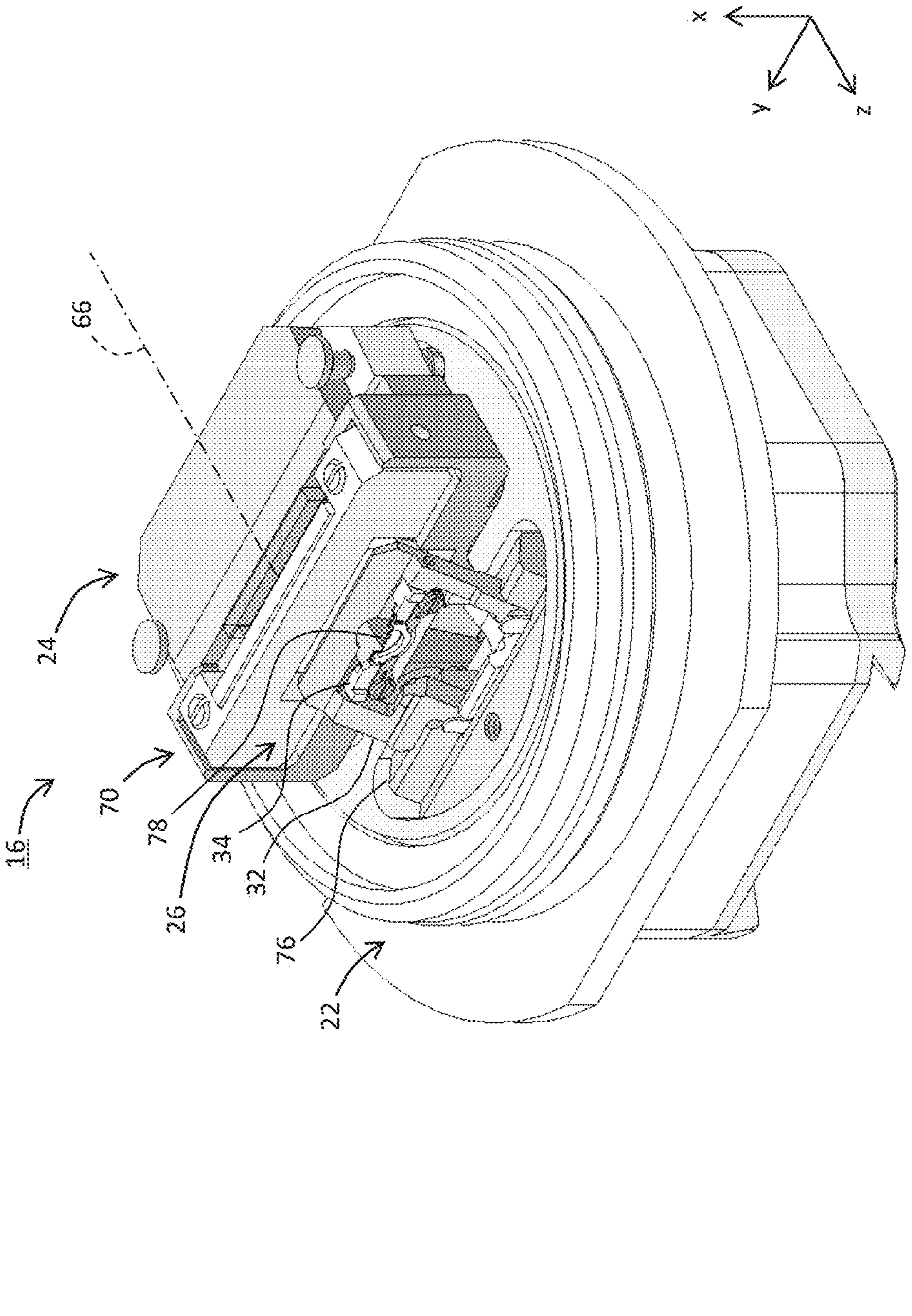
FIG. 5 is a further perspective view of the specimen processing holder according to the first embodiment.

FIG. 5 illustrates a rear side of the holder 16. The first sub holder 24 and the second sub holder 26 are assembled to the holder body 22. The second sub holder 26 includes a second sub holder body 76 having a container portion into which the cartridge 32 is inserted. The cartridge 32 includes the movable mount 34 that holds the support member 78. The anti-contamination unit 70 is disposed before the cartridge 32.

Figure 6:
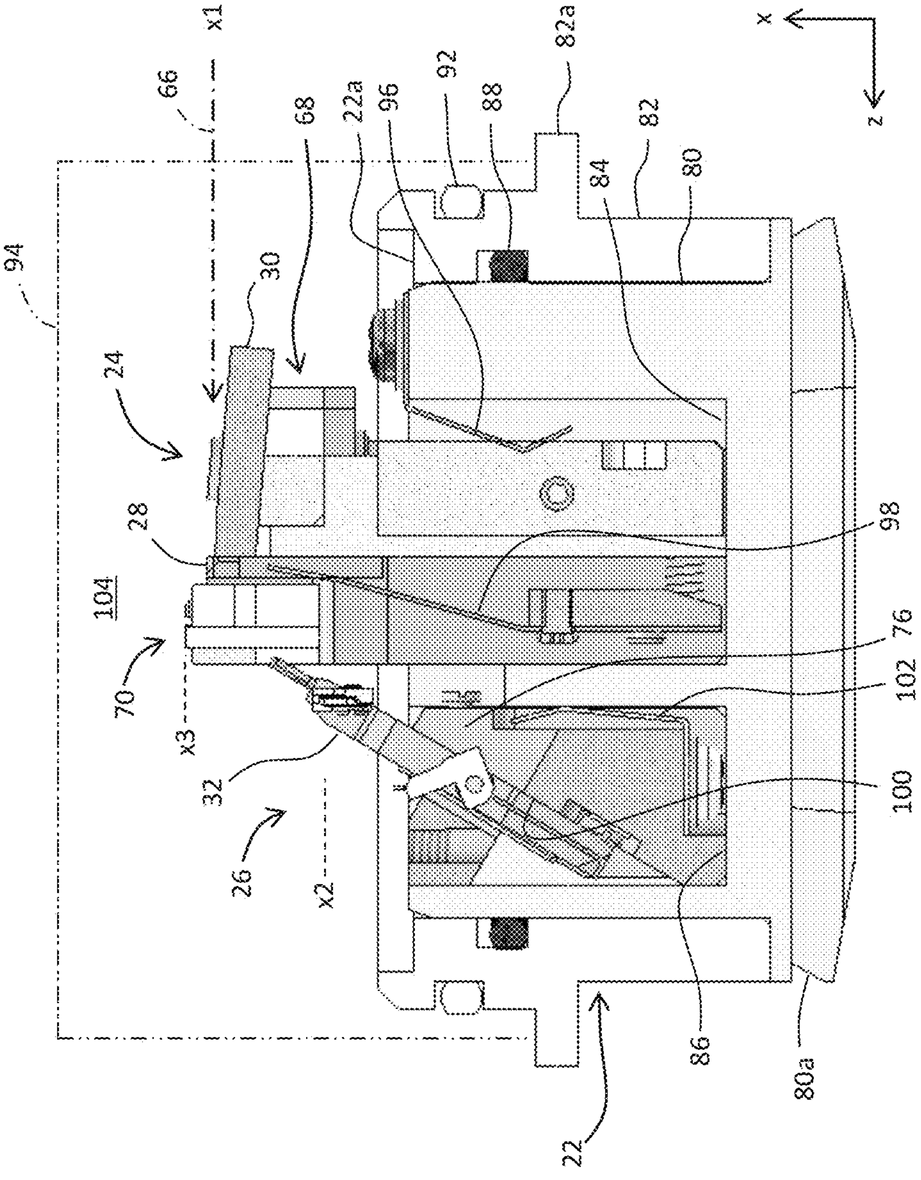
FIG. 6 is a cross section of the specimen processing holder according to the first embodiment.

FIG. 6 illustrates an xz cross section of the holder 16. The holder body 22 is composed of a core member 80, and a cover member 82 including a flange 82*a* extending in the yz direction. A space between the core member 80 and the cover member 82 is sealed with an O ring 88. When a cap 94 is attached to the holder 16, a space between the holder 16 and the cap 94 is sealed with an O ring 92.

The core member 80 includes a base 80*a*. The core member 80 further includes a first well 84 and a second well 86 each having an opening connected to the top face 22*a* that faces in the x-direction. A space adjacent the top face 22*a* is a process space 104. An upper part of the first sub holder 24 and an upper part of second sub holder 26 are located within the process space 104.

A lower part of the first sub holder 24 is removably inserted and stored within the first well 84, and a lower part of the second sub holder 26 is removably inserted and stored in the second well 86. A leaf spring 96 secures the first sub holder 24, a leaf spring 98 secures the primary specimen 28, and a leaf spring 102 secures the second sub holder 26.

The anti-contamination unit 70 is disposed behind the first sub holder 24. The second sub holder body 76 includes a container portion 100 or an inclined cavity into which the cartridge 32 is inserted.

In the illustrated example configuration, the height of the center axis 66 is indicated with x1, which is equal to the height of the process end of the primary specimen 28. The height of the support end of the support member is indicated with x2 that may be lower than the x1 or the same as x1. The height of the uppermost end of the anti-contamination plate of the anti-contamination unit is indicated with x3 that is higher than x1.

Figure 7:
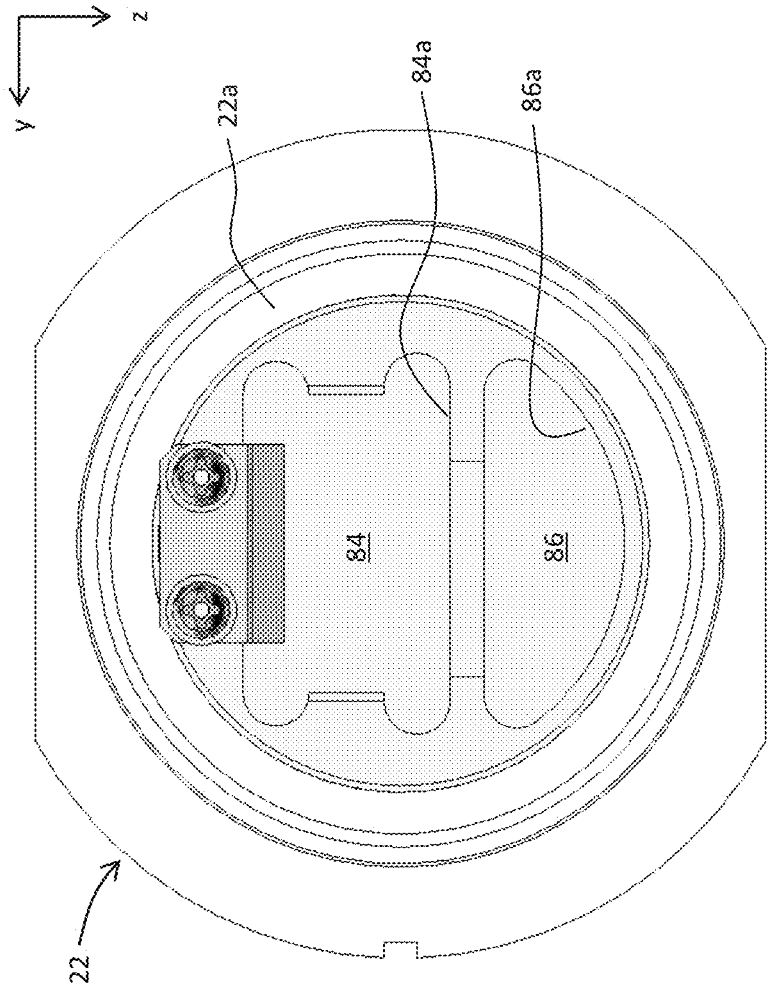
FIG. 7 is a top view of a holder body according to the first embodiment.

FIG. 7 illustrates the top face 22*a* of the holder body 22. The holder body 22 includes the first well 84 and the second well 86. An opening 84*a* of the first well 84 and an opening 86*a* of the second well 86 are connected to the top face 22*a*. The holder body 22 is made of a metal material having excellent thermal conductivity.

Figure 8:
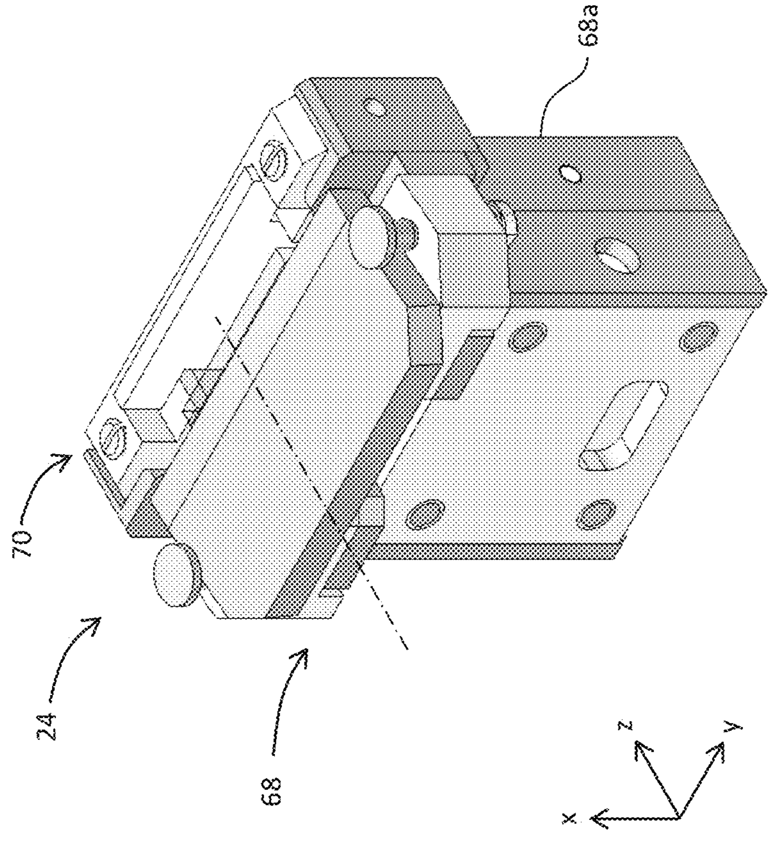
FIG. 8 is a perspective view of a first sub holder according to the first embodiment.

FIG. 8 illustrates the first sub holder 24 including the first sub holder body 68 having a lower part 68*a* having a prism shape. In the example configuration illustrated in FIG. 8, the anti-contamination unit 70 is attached to the first sub holder body 68.

Figure 9:
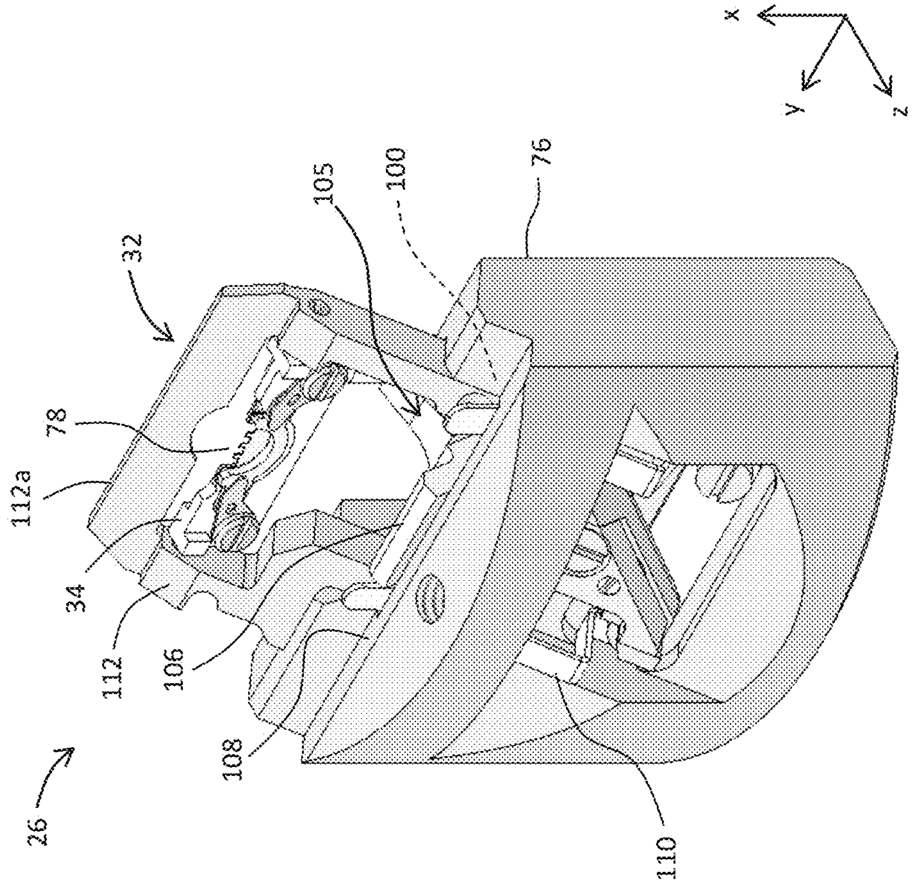
FIG. 9 is a perspective view of a second sub holder according to the first embodiment.

FIG. 9 illustrates the second sub holder 26 including the second sub holder body 76 having a center axis parallel to the x direction. The second sub holder body 76 includes the inclined container portion 100. The center axis of the container portion 100 is inclined relative to the x direction by a predetermined angle that is −30 degrees, for example.

A rear end of the cartridge 32 is inserted in the container portion 100. The cartridge 32 includes a frame 112, an inclination mechanism 105, and the movable mount 34, for example. The support member 78 is attached on the movable mount 34. The inclination mechanism 105 has a lever 106. During insertion of the cartridge 32 into the container portion 100, a portion or a contact portion 108 of the second sub holder body 76 contacts the lever 106 and applies a pressing force to the lever 106. The pressing force actuates the inclination mechanism 105 to change the angle of the movable mount 34. Specifically, the movable mount 34 is inclined relative to the center axis of the cartridge 32 by +30 degrees, for example. The inclination angle of the movable mount 34 is determined so as not to allow the frame 112 to inhibit processing and observation of the specimen.

In the illustrated example configuration, in a state where the cartridge 32 is mounted, the inclination angle of −30 degrees of the container portion 100 and the inclination angle of +30 degrees of the movable mount 34 cancel each other, thereby fixing the orientation of the support member 78, and specifically the orientation of the front face of the support end, in the positive x-direction. The leaf spring 110 applies an elastic force to the cartridge 32 to secure the cartridge 32.

The frame 112 includes an arc shape portion surrounding the movable mount 34; however, the movable mount 34 that is inclined relative to the frame 112 in the state where the cartridge 32 is mounted enables irradiation of the secondary specimen attached to the support end with the second ion beam and the electron beam.

Figure 10:
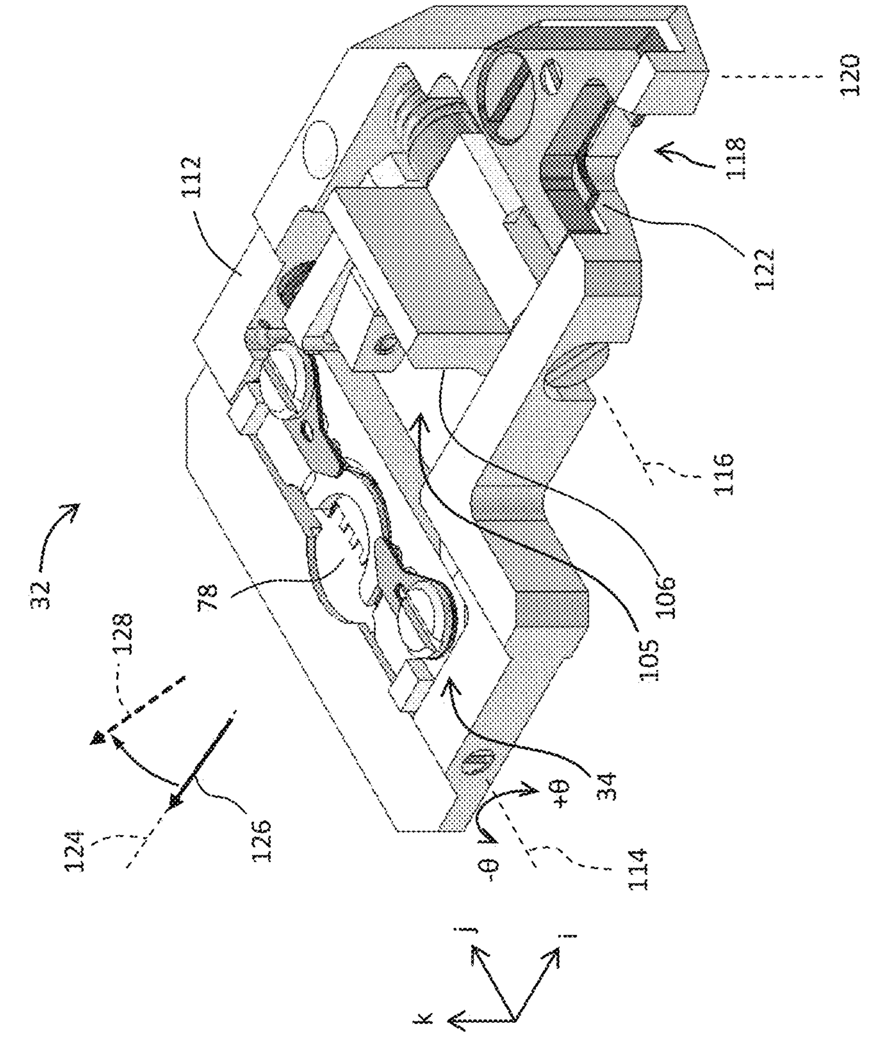
FIG. 10 is a perspective view of a cartridge according to the first embodiment.

FIG. 10 is an enlarged view of the cartridge 32. While the cartridge 32 illustrated in FIG. 10 has a shape that is slightly different from the shape of the cartridge illustrated in FIG. 9, the two cartridges have identical structures.

In FIG. 10, the movable mount 34 is disposed in the frame 112 such that the movable mount 34 is movable in an inclined manner. The support member 78 is secured to the movable mount 34. Reference numeral 114 indicates a rotation axis of the movable mount 34; the clockwise direction corresponds to the positive rotation direction and the counter clockwise direction corresponds to the negative rotation direction. The inclination mechanism 105 has the lever 106, and the rotation axis of the lever 106 is indicated with reference numeral 116. A lock mechanism 118 restricts the movement of the lever 106. The lock mechanism 118 has a rotation plate 122, and the rotation axis of the rotation plate 122 is indicated with reference numeral 120.

The inclination mechanism 105 has a torsional spring described below. The torsional spring applies an elastic force in the −θ direction to the movable mount 34. The operation of the rotation plate 122 restricts the positive rotating movement (or the rotating movement toward the viewer in FIG. 10) of the lever 106 to maintain the angle of the movable mount 34 to 0 degrees. Applying a pressing force to the lever 106 in this state causes the negative rotating movement of the lever 106. The inclination mechanism 105 transforms the negative rotating movement of the lever 106 into the positive rotating movement of the movable mount

34. Reference numeral 124 indicates the center axis of the cartridge 32. The orientation of the support member 78 before insertion of the cartridge 32 into the container portion is indicated with reference numeral 126, and the orientation of the support member 78 after insertion of the cartridge 32 into the container portion is indicated with reference numeral 128.

Figure 11:
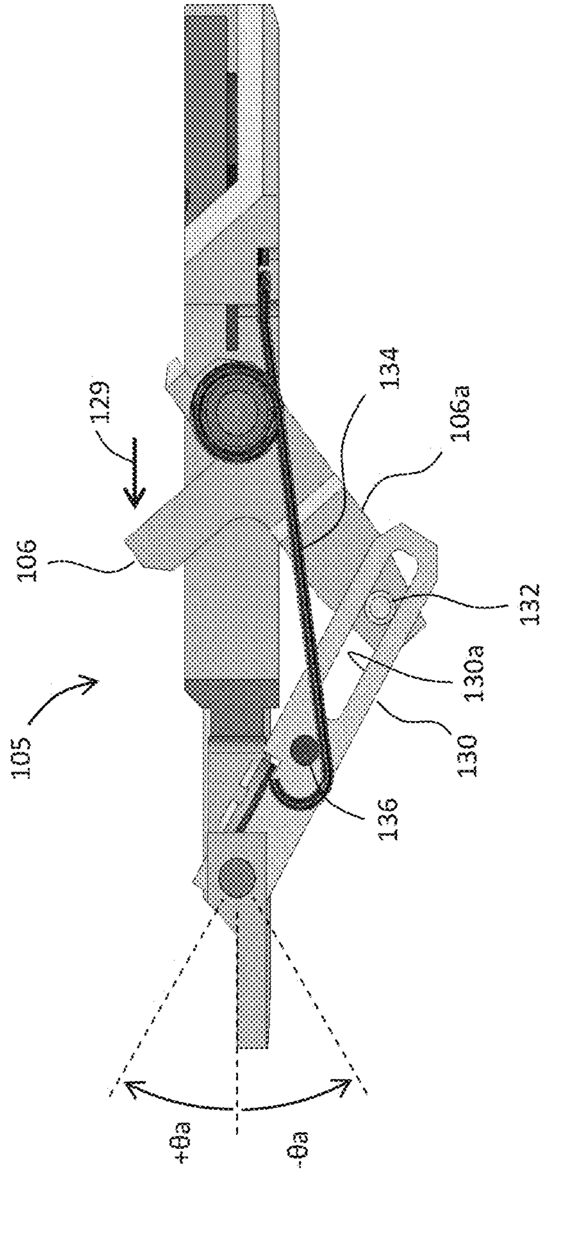
FIG. 11 is a cross sectional view of the cartridge according to the first embodiment.

FIG. 11 illustrates the configuration and operation of the inclination mechanism 105. The lever 106 includes an arm 106*a* having an end with a pin 132. An arm 130 coupled to the movable mount has a long hole 130*a* into which the pin 132 is inserted. A torsional spring 134 continuously applies an elastic force to a pin 136 disposed on the arm 130. Therefore, an elastic force in the −θ direction is always applied to the arm 130. Meanwhile, a pressing force 129 applied to the lever 106 causes the inclination mechanism 105 to operate to rotate the arm 130 in the +θ direction. The maximum positive inclination angle +θa is +30 degrees and the maximum negative inclination angle −θa is −30 degrees.

Figure 12:
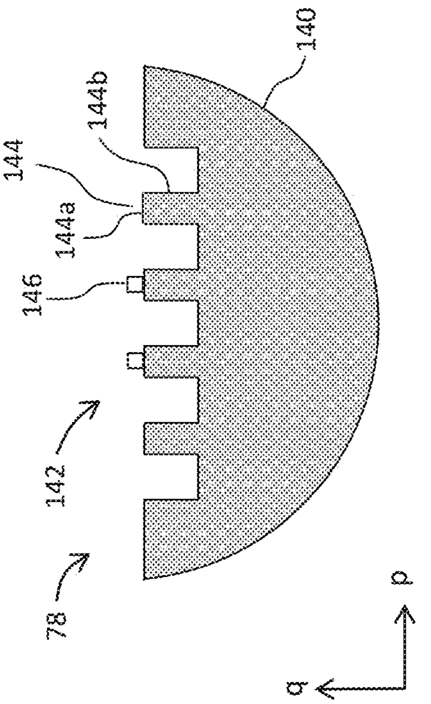
FIG. 12 is a plan view of a support member.

FIG. 12 illustrates an example support member. The support member 78 includes a semicircular body 140 including a protrusion array 142 that corresponds to a support end. The protrusion array 142 is composed of a plurality of protrusions 144 arranged along a p direction. Each protrusion 144 has a front face 144*a* and two side faces 144*b*. The orientation of the front face 144*a* corresponds to the orientation of the support member 78. The secondary specimen 146 is to be attached to any one of the front faces 144*a* or the side faces 144*b*.

Figure 13:
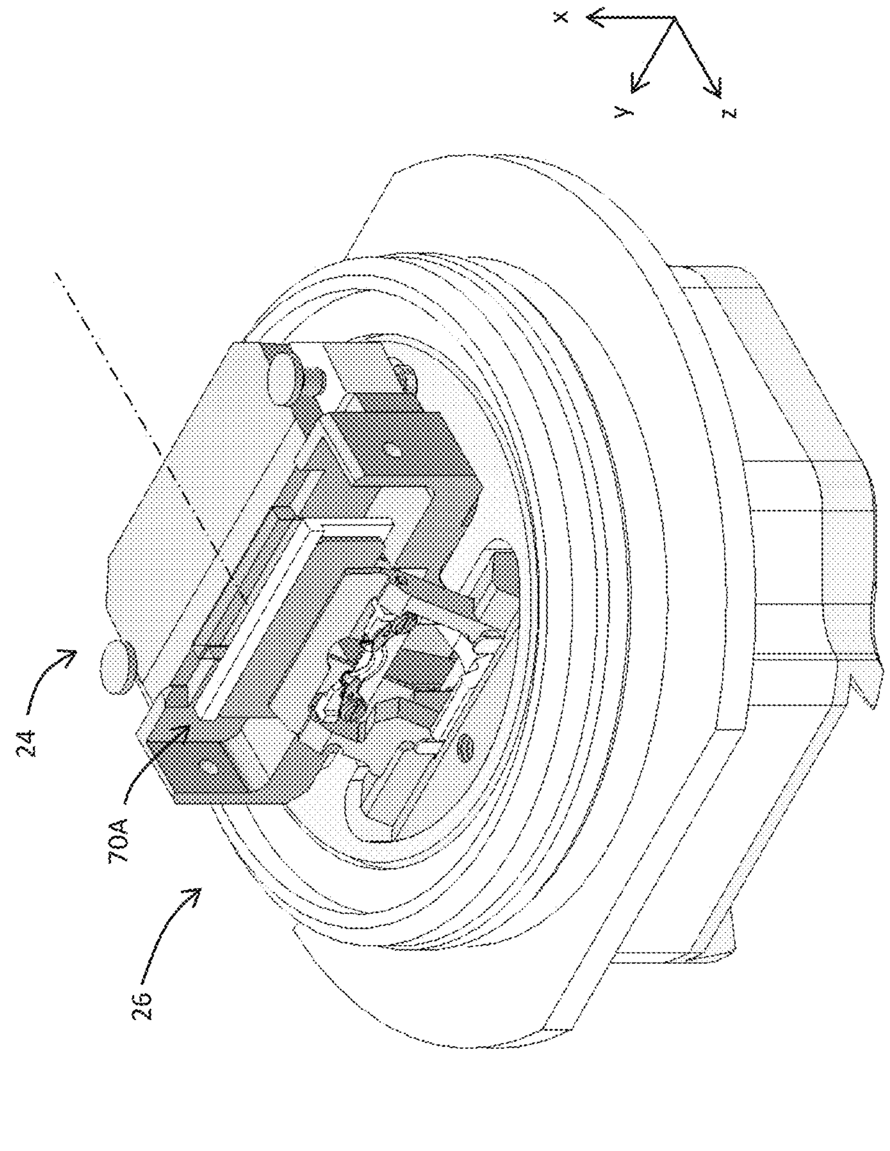
FIG. 13 is a perspective view of a specimen processing holder including a second example anti-contamination unit.

FIG. 13 illustrates a holder including a second example anti-contamination unit. Referring to FIG. 13, an anti-contamination unit 70A is disposed between the first sub holder 24 and the second sub holder 26. While in the first example illustrated in FIG. 4, for example, the anti-contamination unit is coupled to the first sub holder 24, in the second example illustrated in FIG. 13, the anti-contamination unit is coupled to the second sub holder 26.

Figure 14:
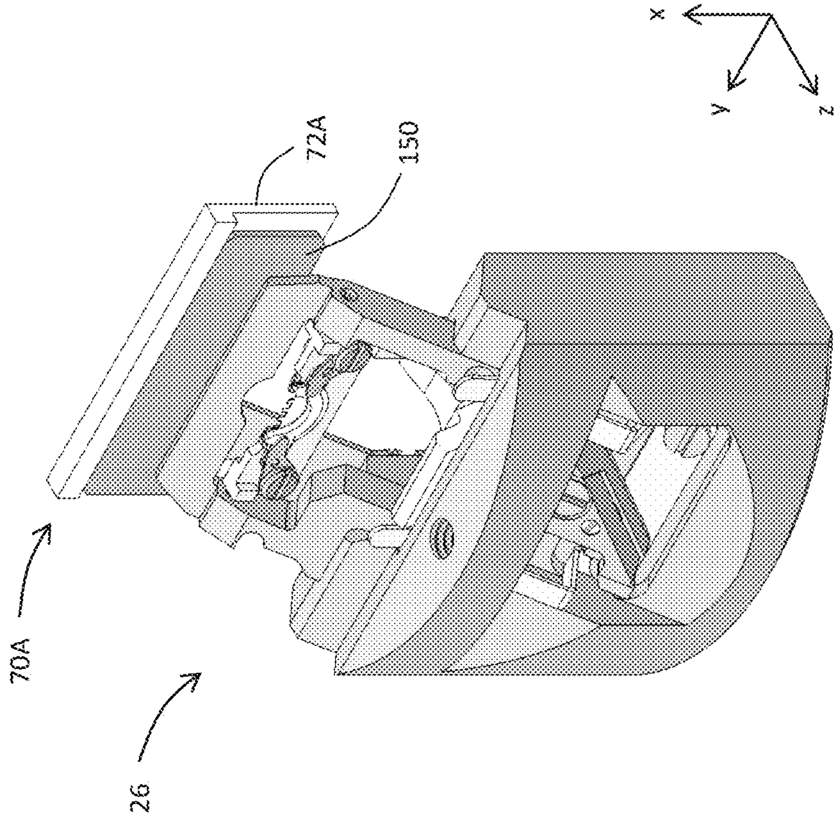
FIG. 14 is a perspective view of a second sub holder including the second example anti-contamination unit.
Figure 15:
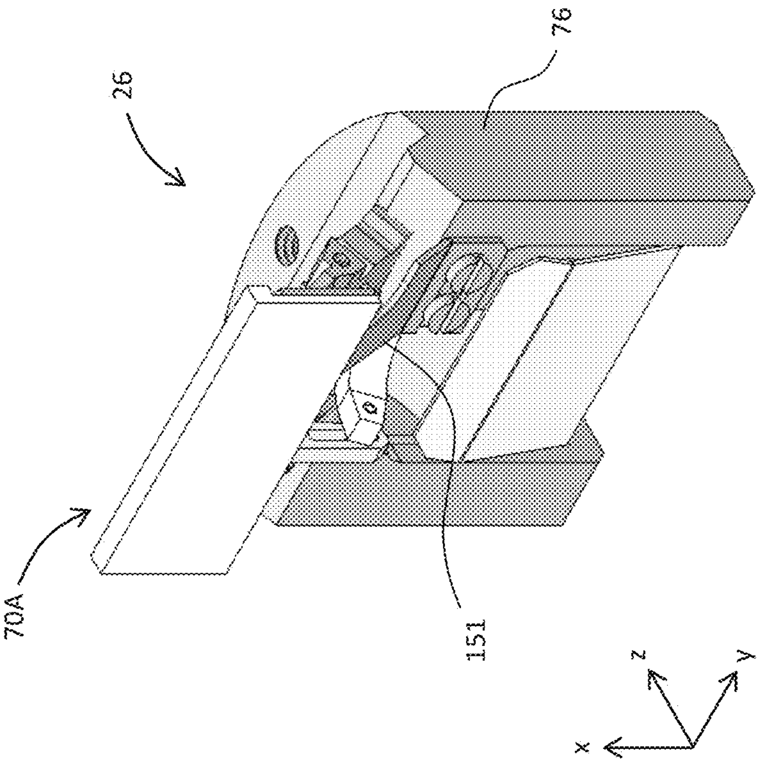
FIG. 15 is a further perspective view of the second sub holder including the second example anti-contamination unit.

FIG. 14 and FIG. 15 illustrate the second sub holder 26. The anti-contamination unit 70A according to the second example is coupled to the second sub holder 26. An anti-contamination plate 72A is fixed to a rear plate 150 that is fixed, via an attachment member 151, to the second sub holder body 76.

Figure 16:
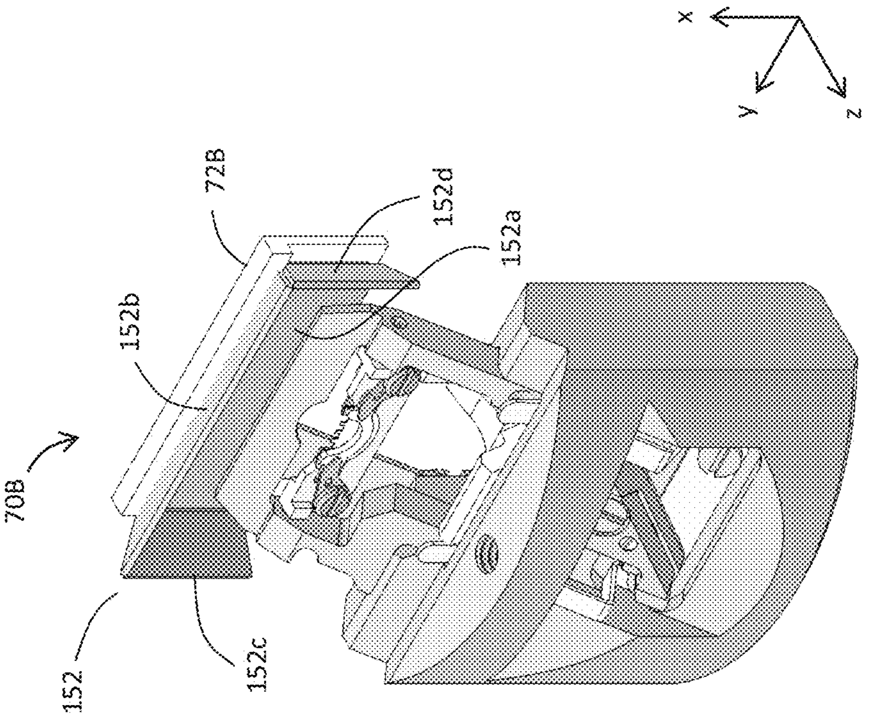
FIG. 16 is a perspective view of the second sub holder including a third example anti-contamination unit.

FIG. 16 illustrates a third example anti-contamination unit. An anti-contamination unit 70B as illustrated includes a rear cover 152 disposed on a rear side of the anti-contamination plate 72B. The rear cover 152 includes a flat portion 152*a*, and a plurality of end portions 152*b*, 152*c*, and 152*d* connecting to the flat portion 152*a*. These end portions 152*b*, 152*c*, and 152*d* cover the periphery of the cartridge to thereby enhance the anti-contamination effect.

Figure 17:
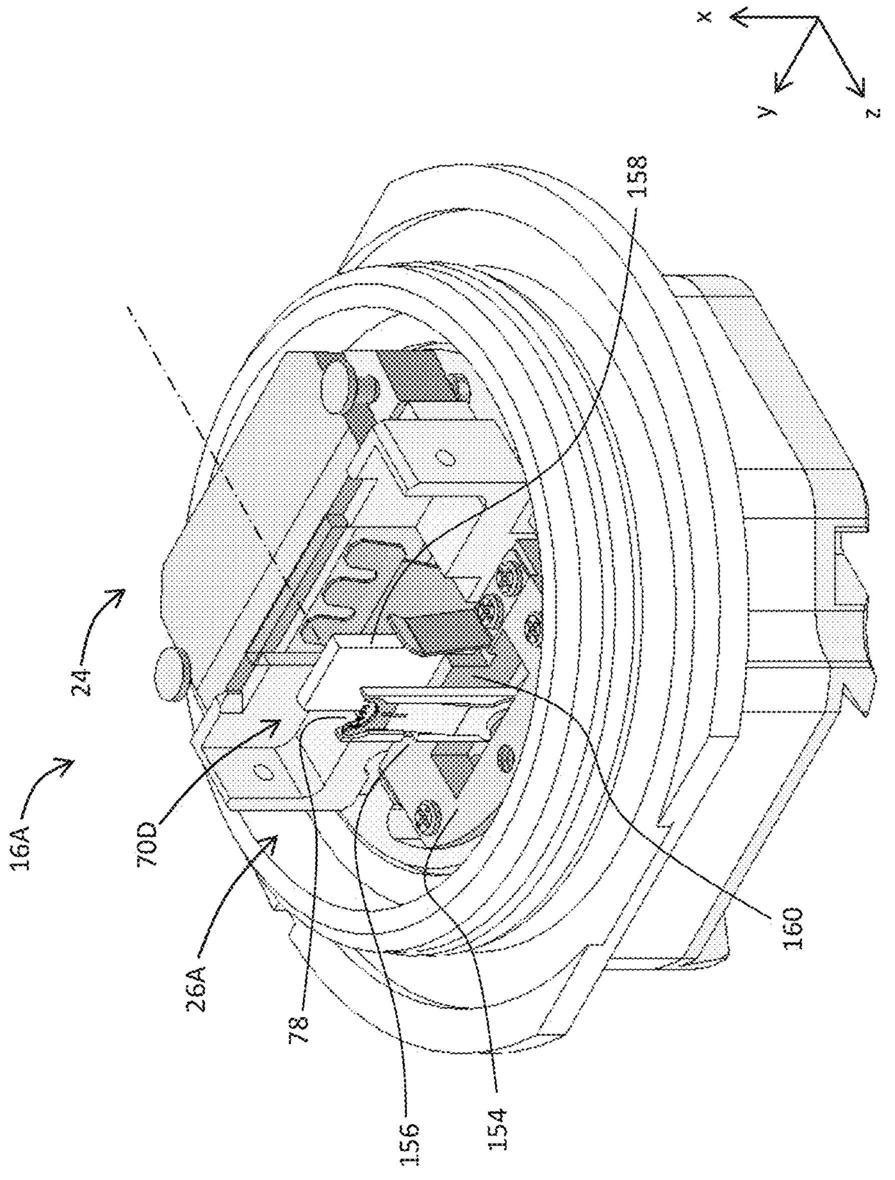
FIG. 17 is a perspective view of a specimen processing holder according to a second embodiment.

Referring to FIG. 17 to FIG. 20, a holder 16A according to a second embodiment will be described. In FIG. 17, the holder 16A includes a first sub holder 24, a second sub holder 26A, and an anti-contamination unit 70D. The second sub holder 26A includes a second sub holder body 154 that holds a cartridge 156 in an upright position. The cartridge 156 holds a support member 78. The anti-contamination unit 70D includes a unit base 160 and an anti-contamination plate 158 that is made of a carbon plate, for example. The unit base 160 holds the anti-contamination plate 158.

Figure 18:
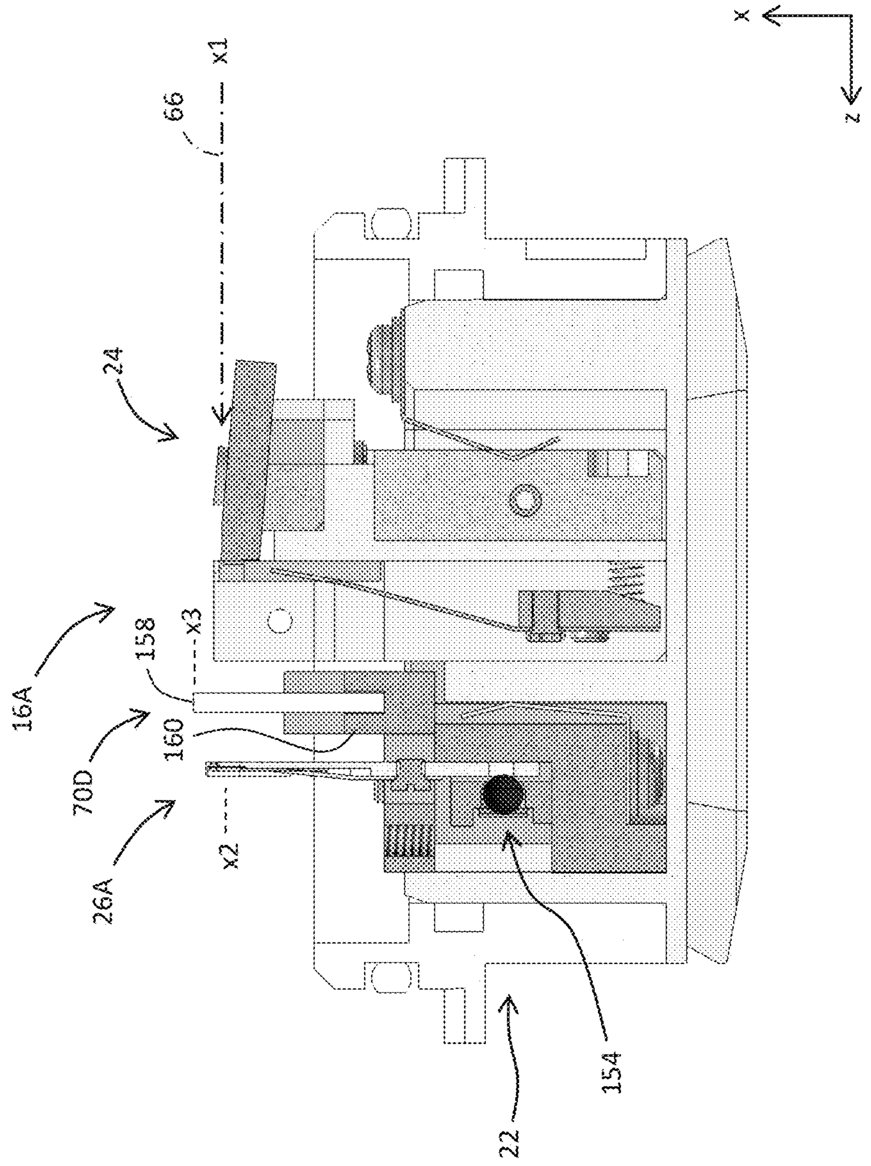
FIG. 18 is a cross sectional view of the specimen processing holder according to the second embodiment.

FIG. 18 illustrates a cross section of the holder 16A according to the second embodiment. The first sub holder 24 and the second sub holder 26A are assembled in the holder body 22. As described above, the anti-contamination unit 70D includes the unit base 160 holding the anti-contamination plate 158. Reference numeral 154 indicates a portion of the second sub holder 26A that removably holds the cartridge. The height x1 of the center axis 66 of the first ion beam is the same as the height x2 of the support end of the support member corresponding to the height of the front face of each protrusion of the support end, for example. The height x3 of the anti-contamination plate 158 is higher than the heights x1 and x2. In the second embodiment, similar to the first embodiment, the entire support member is shielded with the anti-contamination plate 158 when viewed from the process end of the primary specimen.

Figure 19:
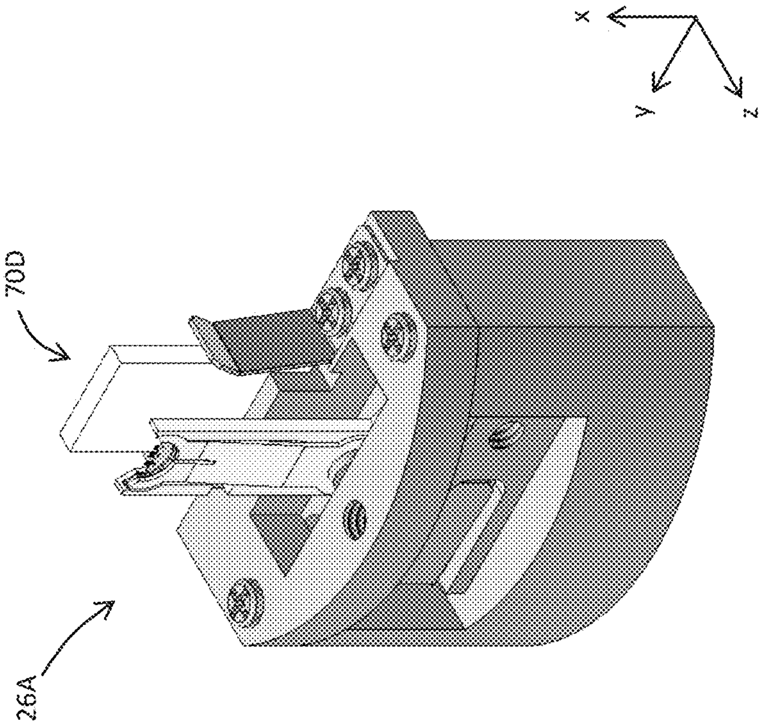
FIG. 19 is a perspective view of a second sub holder according to the second embodiment.
Figure 20:
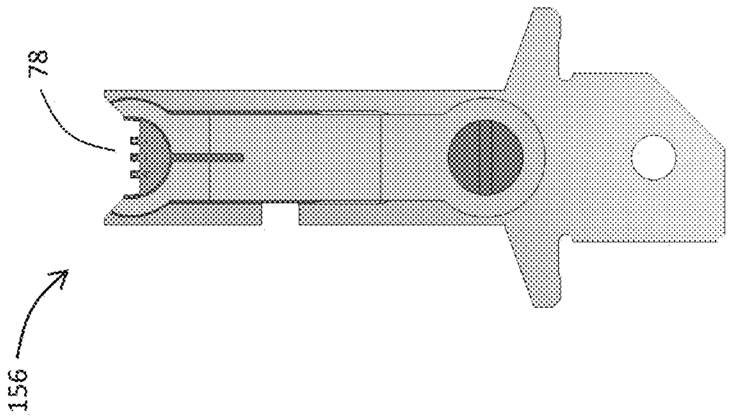
FIG. 20 is a plan view of a cartridge according to the second embodiment.

FIG. 19 illustrates the second sub holder 26A according to the second embodiment. The anti-contamination unit 70D is coupled with the second sub holder 26A. FIG. 20 illustrates the cartridge 156 according to the second embodiment. The cartridge 156 has an elongated shape and removably holds the support member 78. The cartridge 156 does not include an inclination mechanism.

Figure 21:
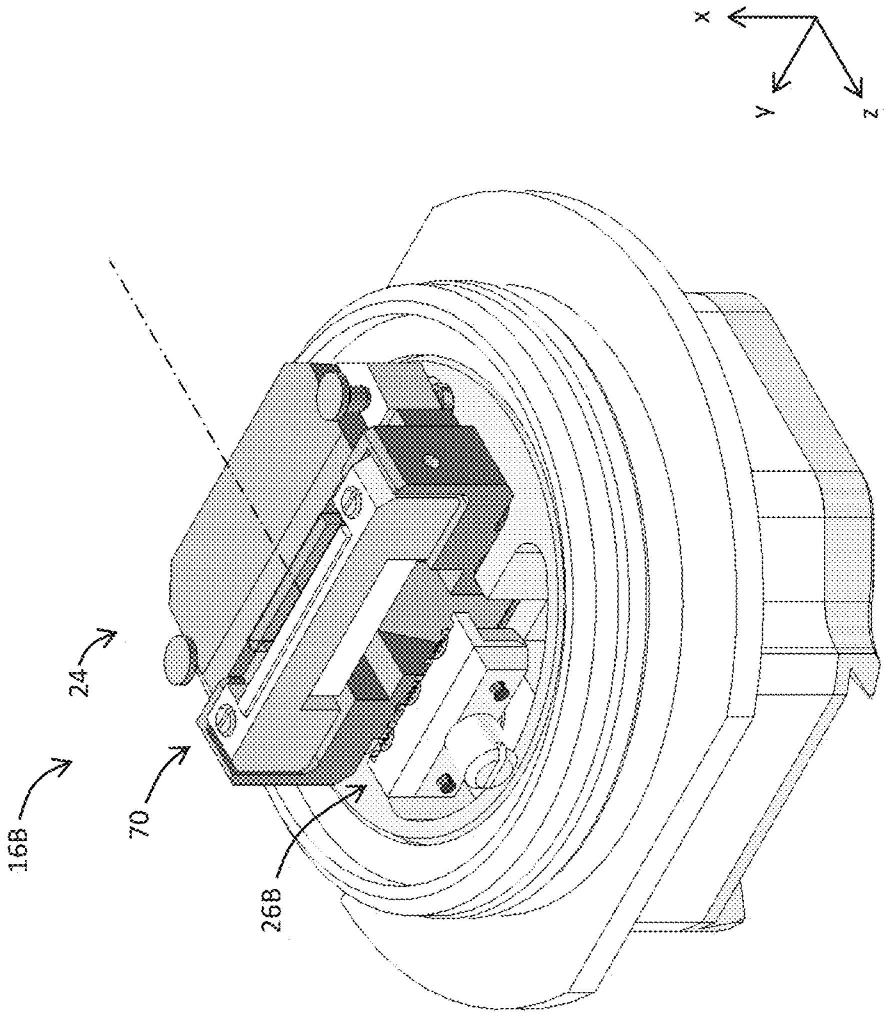
FIG. 21 is a perspective view of a specimen processing holder according to a third embodiment.
Figure 22:
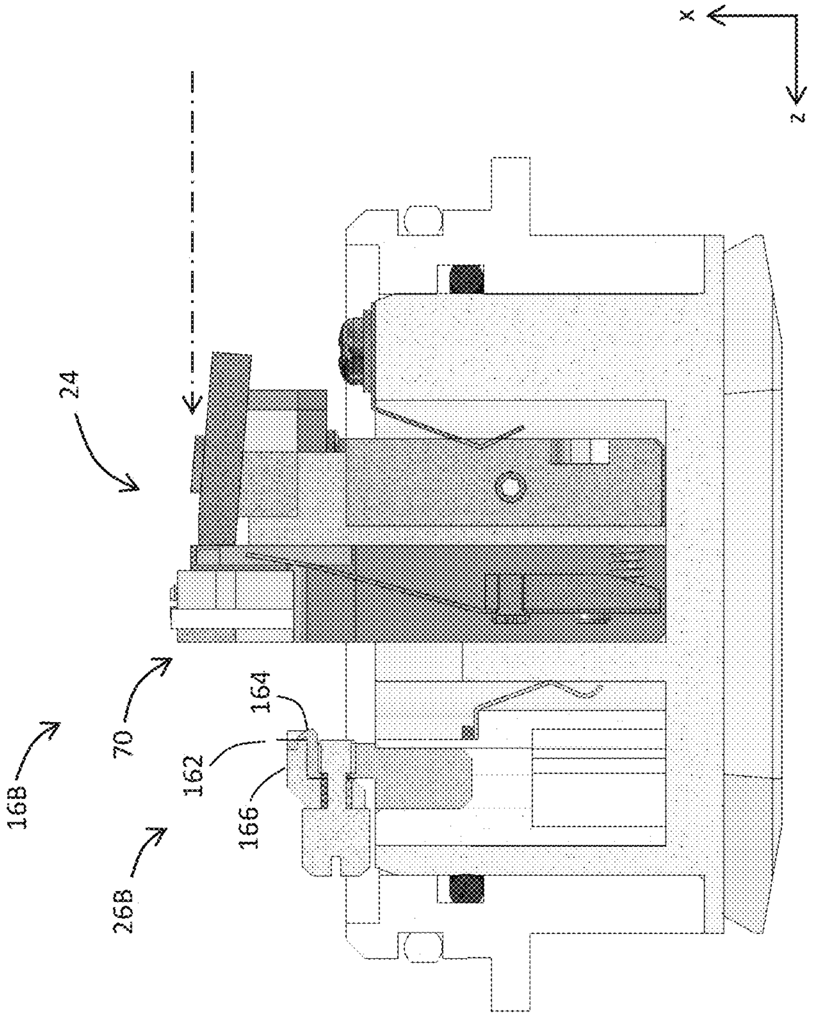
FIG. 22 is a cross sectional view of the specimen processing holder according to the third embodiment.
Figure 23:
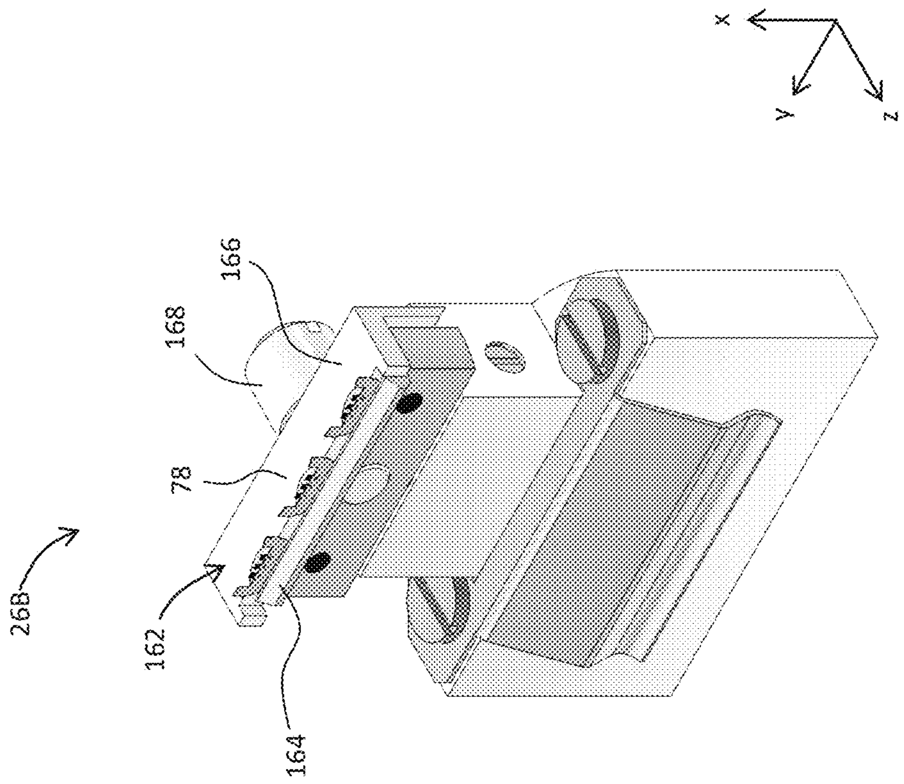
FIG. 23 is a perspective view of a second sub holder according to the third embodiment.

Referring now to FIG. 21 to FIG. 23, a holder 16B according to a third embodiment will be described. In FIG. 21, the holder 16B includes a first sub holder 24, a second sub holder 26B, and an anti-contamination unit 70.

FIG. 22 illustrates a cross section of the holder 16B according to the third embodiment. The anti-contamination unit 70 is coupled to a rear face of the first sub holder 24. The second sub holder 26B includes a clamp mechanism that holds a support member array 162 including a plurality of support members arranged in the y direction. The clamp mechanism includes a clamp piece 164 and a clamp piece 166. A single support member may be held by the clamp mechanism.

FIG. 23 illustrates the second sub holder 26B according to the third embodiment. In the illustrated example configuration, the support member array 162 held by the second sub holder 26B includes three support members 78. Rotating operation of a grip 168 increases or decreases an interval between the two clamp pieces 164 and 166.

Figure 24:
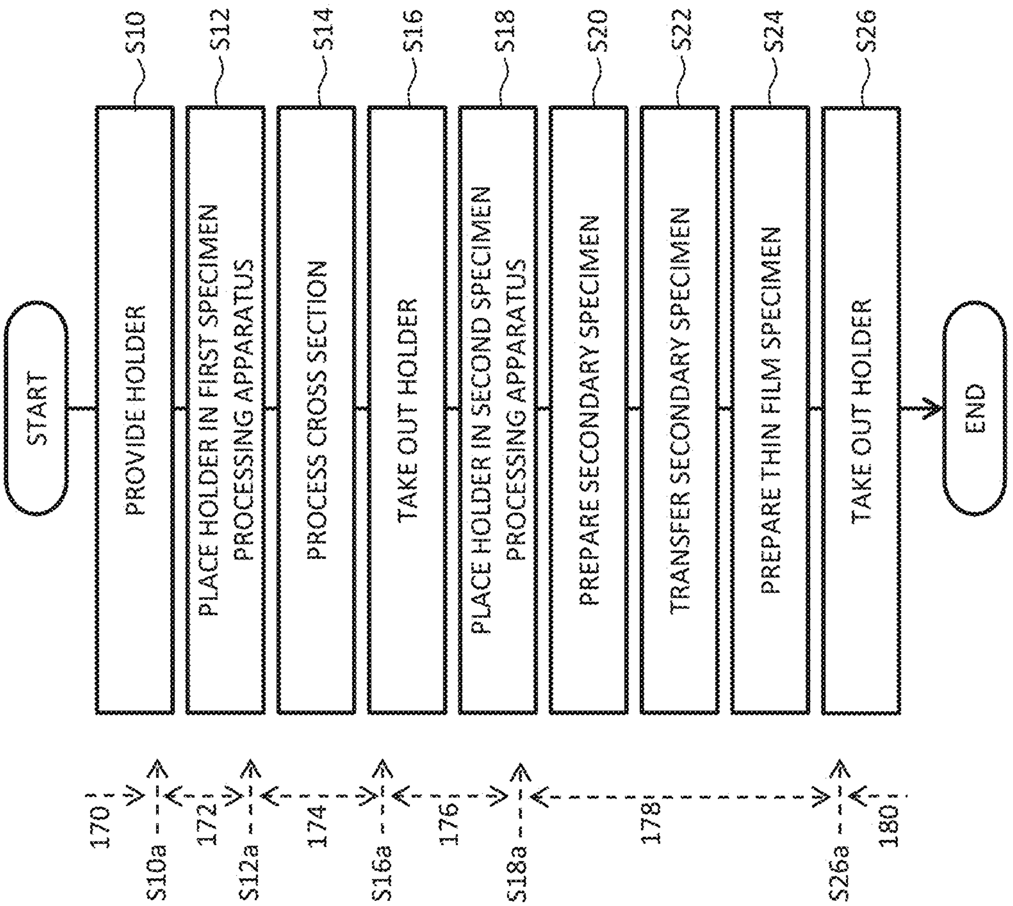
FIG. 24 is a flowchart showing a specimen processing method according to an embodiment.

FIG. 24 shows a specimen processing method according to an embodiment. The following description is based on the precondition that a cartridge is used; however, each of the processes described below may also be performed for a configuration without a cartridge.

In step S10, a holder is provided. More specifically, a first sub holder holding a primary specimen is mounted to a holder body. A second sub holder including a cartridge holding a support member is also mounted to the holder body. An anti-contamination unit is coupled with either the first sub holder or the second sub holder.

In step S12, the holder is placed in a specimen chamber of a first specimen processing apparatus. More specifically, the holder is secured to a movable stage within the specimen chamber, which creates a first state. In step S14, the primary specimen held by the first sub holder is irradiated with a first ion beam and is thus subjected to cross section processing. During the cross section processing, contaminants fly off rearward from a processed portion, and the flying contaminants are caught by an anti-contamination plate of the anti-contamination unit. In other words, the anti-contamination plate prevents flying and spreading of the contaminants from the processed cross section to the support member.

After completion of the processing of the primary specimen, in step S16, the holder is taken out from the specimen chamber of the first specimen processing apparatus and is then placed within a specimen chamber of a second specimen processing apparatus. More specifically, the holder is secured to a movable stage in the specimen chamber, which creates a second state. In step S20, the processed primary specimen held by the first sub holder is irradiated with a second ion beam for further processing. This processing prepares a secondary specimen having a block shape, for example. A secondary specimen having a thin film shape may be prepared at this stage.

In step S22, the secondary specimen is transferred from the first sub holder to the second sub holder with the second state being maintained. In transferring the secondary specimen, a pickup apparatus disposed in the second specimen processing apparatus is used. Specifically, the secondary specimen is attached to a front face or a side face of one of protrusions in the support member. Here, a plurality of secondary specimens may be attached. In step S24, the attached secondary specimen is irradiated with a second ion beam and a thin film specimen or a processed secondary specimen is prepared. During processing of the primary specimen and the secondary specimen, a processed portion is observed by a scanning electron microscope, as required.

In step S26, the holder is taken out from the specimen chamber of the second specimen processing apparatus. Thereafter, the second sub holder is removed from the holder, and the cartridge is subsequently removed from the second sub holder. The removed cartridge is then attached to an observation holder (TEM holder). Subsequently, the thin film specimen is observed by a transmission electron microscope. In a configuration in which the observation holder or the cartridge includes a mechanism for changing the orientation of the thin film specimen, the orientation of the thin film specimen is changed using the mechanism.

The specimen processing method described above eliminates the need for change of holders and attachment and removal of a cartridge during the specimen processing, thereby protecting the specimen and also reducing working burden. The above specimen processing method further effectively prevents contamination of the support member during processing of the primary specimen.

In the above specimen processing method, an operator performs various tasks including, for example, attachment and removal of the cartridge and the sub holder and transfer and mounting of the holder. However, some or all of these tasks may be automated.

To perform processing of a specimen without exposing the specimen to the air, the specimen processing is modified. Referring to FIG. 24, the modified specimen processing will be described.

In step S10, a holder is provided within a glove box, for example. Reference numeral 170 indicates a time period in which a task is performed in the glove box. After completion of preparation of the holder, in step S10*a*, a cap is mounted on the holder within the glove box. A container for transfer (transfer vessel) is thus formed. The container typically contains inert gas such as argon. The specimen is cooled as required, and the cooled condition is maintained. Reference numeral 172 indicates a time period in which the cap is mounted.

In step S12, the holder is placed in the specimen chamber of the first specimen processing apparatus, which creates a first state. Thereafter, in step S12*a*, the cap is removed from the holder. The specimen chamber is a vacuum chamber where the primary specimen is not exposed to the air. Reference numeral 174 indicates a time period in which the cap is removed. In step S14, the first specimen processing apparatus processes the primary specimen. After completion of the processing, in step S16*a*, the cap is mounted on the holder. Thereafter, in step S16, the holder is taken out from the first specimen processing apparatus. Reference numeral 176 indicates a time period in which the cap is mounted.

In step S18, the holder is placed within the specimen chamber of the second specimen processing apparatus. Thereafter, in step S18*a*, the cap is removed from the holder. Reference numeral 178 indicates a time period in which the cap is removed. After completion of preparation of a thin film specimen through steps S20 to S24, in step S26*a*, the cap is attached on the holder, thereby forming the container. Subsequently, the container is taken out from the specimen chamber of the second specimen processing apparatus. Then, tasks are performed with respect to the holder within the glove box. Finally, a state where a cartridge or a support member is attached to the observation holder is formed.

The modified specimen processing method described above enables protection of the specimen during the specimen processing. It is also possible to maintain the cooled condition of the specimen, as required. When the prepared thin film specimen is in a stable condition, attachment of the cap to the holder may be omitted in step S26*a*.

A modification example of the embodiments described above will now be described. The anti-contamination unit may include a mechanism for raising and lowering the anti-contamination plate. In this configuration, the vertical position of the anti-contamination plate may be adjusted in accordance with the positional relationship between the two sub holders. Alternatively, the anti-contamination plate may be placed in a raised position during processing of the primary specimen in the first specimen processing apparatus and may be placed in a lowered position during processing of the secondary specimen transferred on the support plate in the second specimen processing apparatus. This configuration prevents the anti-contamination plate from obstructing the processing and observation of the secondary specimen.

The two sub holders may be secured to the holder body. However, to facilitate handling of the specimen or the cartridge, the two sub holders may be removable from the holder body.

The specimen processing holder described above may be disposed in a specimen observation apparatus or a specimen analyzing apparatus. The specimen observation apparatus is a scanning electron microscope, for example. The specimen analyzing apparatus is an electronic probe microanalyzer.

The invention claimed is:

1. A specimen processing holder comprising:

a holder body;

a first sub holder disposed on the holder body and including sing a shield member configured to partially block a first ion beam to generate a shaped first ion beam, the first sub holder configured to hold a primary specimen to be processed with the shaped first ion beam; and a second sub holder disposed on the holder body, the second sub holder configured to hold a secondary specimen prepared by processing the primary specimen with a second ion beam.

2. The specimen processing holder according to claim 1, wherein the specimen processing holder has an x direction, a y direction, and a z direction orthogonal to one another, the z-direction is parallel to a center axis of the first ion beam, the shield member includes a shield face extending in the y direction and the z direction, and the first sub holder and the second sub holder are arranged along the z direction.

3. The specimen processing holder according to claim 2, wherein assuming that upstream and downstream in the z direction are defined in accordance with a traveling direction of the first ion beam, the second sub holder is disposed downstream of the first sub holder along the z direction.

4. The specimen processing holder according to claim 3, wherein the first sub holder is configured to hold the primary specimen with a process end of the primary specimen protruding from the shield face, the second sub holder is configured to directly or indirectly hold a support member having a support end that is configured to support the secondary specimen, and an anti-contamination plate is disposed between the process end and the support end.

5. The specimen processing holder according to claim 4, wherein the anti-contamination plate extends in the x direction and the y direction.

6. The specimen processing holder according to claim 2, wherein the holder body comprises:

a top face facing in the x direction;

a first well having a first opening connected to the top face, the first well housing the first sub holder; and a second well having a second opening connected to the top face, the second well housing the second sub holder, and wherein the first well and the second well are arranged along the z direction.

7. The specimen processing holder according to claim 1, further comprising:

a cartridge configured to hold a support member configured to support the secondary specimen, wherein the second sub holder is configured to hold the cartridge.

8. The specimen processing holder according to claim 7, wherein the cartridge comprises:

a movable mount holding the support member; and an inclination mechanism configured to incline the movable mount;

the second sub holder comprises:

a container portion configured to receive the cartridge that is inserted therein; and a portion configured to come into contact with the inclination mechanism during insertion of the cartridge into the container portion to cause the inclination mechanism to operate.

9. A specimen processing method comprising:

providing a specimen processing holder comprising a first sub holder configured to hold a primary specimen and a second sub holder configured to hold a support member;

processing the primary specimen in a first state where the specimen processing holder is disposed within a first specimen chamber of a first specimen processing apparatus;

after the processing of the primary specimen, transferring the specimen processing holder from the first specimen chamber into a second specimen chamber of a second specimen processing apparatus;

preparing a secondary specimen from the processed primary specimen in a second state where the specimen processing holder is disposed within the second specimen chamber;

moving the secondary specimen onto the support member in the second state; and preparing an observation specimen from the secondary specimen disposed on the support member.

10. The specimen processing method according to claim 9, wherein the second sub holder is configured to hold a cartridge including the support member, and after the preparing of the observation specimen, the cartridge is removed from the second sub holder and is mounted on an observation holder.

11. The specimen processing method according to claim 9, wherein a cap is attached to the specimen processing holder before transferring the specimen processing holder, in the second state, the cap is removed from the specimen processing holder before preparing the secondary specimen from the processed primary specimen.

12. The specimen processing method according to claim 9, wherein contaminants generated by processing of the primary specimen are caught by an anti-contamination plate disposed between the primary specimen and the support member.

* * * * *